(12) United States Patent
Kim et al.

(10) Patent No.: US 6,783,626 B2
(45) Date of Patent: Aug. 31, 2004

(54) TREATMENT AND EVALUATION OF A SUBSTRATE PROCESSING CHAMBER

(76) Inventors: Nam-Hun Kim, 7767 Lilac Way, Cupertino, CA (US) 95014; Chong Hwan Chu, 2666 Minton Ct., Pleasanton, CA (US) 94566

( * ) Notice: Subject to any disclaimer, the term of this patent is extended or adjusted under 35 U.S.C. 154(b) by 21 days.

(21) Appl. No.: 09/859,039

(22) Filed: May 14, 2001

(65) Prior Publication Data

US 2003/0052083 A1 Mar. 20, 2003

(51) Int. Cl.[7] .......................... H05H 1/00; C23C 16/00; H01L 21/00
(52) U.S. Cl. ........................ 156/345.24; 156/345.25; 118/712; 438/710
(58) Field of Search ................... 156/345.24, 345.25, 156/345.26, 345.27, 345.28; 118/715, 712, 695; 438/710, 714

(56) References Cited

U.S. PATENT DOCUMENTS

| | | | |
|---|---|---|---|
| 5,322,590 A | * 6/1994 | Koshimizu | 438/9 |
| 5,571,366 A | * 11/1996 | Ishii et al. | 156/345.26 |
| 5,733,820 A | * 3/1998 | Adachi et al. | 438/719 |
| 5,958,258 A | * 9/1999 | Ishihara et al. | 216/60 |
| 6,090,718 A | 7/2000 | Soga et al. | |

OTHER PUBLICATIONS

Chen, et al "Effect of First Wafer on the CD Bias in DARC/Poly Gate Structure", Chartered Semiconductor Manufacturing Ltd, dated May 15, 2001.

* cited by examiner

Primary Examiner—Parviz Hassanzadeh
(74) Attorney, Agent, or Firm—Janah & Associates; Joseph Bach

(57) ABSTRACT

A substrate processing apparatus has a chamber having a substrate transport to transport a substrate onto a substrate support in the chamber, a gas supply to provide a gas in the chamber, a gas energizer to energize the gas, and an exhaust to exhaust the gas. A detector is adapted to detect a first intensity of a first wavelength of a radiation emission from an energized gas in the chamber and generate a first signal in relation to the first intensity and to detect a second intensity of a second wavelength of the radiation emission and generate a second signal in relation to the second intensity. A controller receives the first and second signals from the detector, performs a mathematical operation on the first and second signals to determine a value related to a condition of the chamber, and treats the chamber in relation to the value by providing instructions to operate one or more of the substrate transport, substrate support, gas supply, gas energizer and gas exhaust.

20 Claims, 6 Drawing Sheets

TREATMENT AND EVALUATION OF A SUBSTRATE PROCESSING CHAMBER

BACKGROUND

Embodiments of the present invention relate to the treatment and evaluation of a substrate processing chamber.

In the fabrication of substrates, such as integrated circuits and flat panel displays, the substrates are processed in a chamber using energized gases. The substrates are typically made of semiconductor, dielectric or conductor materials. Layers of such materials may also be deposited or otherwise formed on a substrate, by chemical vapor deposition (CVD), physical vapor deposition, ion implantation, oxidation or nitridation processes. Thereafter, the substrate or its overlying layers may be etched in suitable etching processes, to form features shaped as cavities, channels or trenches, in the substrates.

In the processing of substrates, a series of substrates in a batch, such as substrates contained in a cassette holder in a load lock chamber, may be individually selected and transported into a process chamber for processing. Although the same process is performed for all the substrates in the series, the first few substrates may often be processed slightly differently than the other substrates in the same series, even though the process conditions maintained in the chamber are the same. The processing differences may be, for example, differences in etching or deposition rates, differences in etching selectivity ratios, or differences in properties of the etched features, such as their critical dimensions. Processing variations between substrates in a series are undesirable because they reduce substrate yields or processing predictability.

Processing variations such as the "first wafer effect," often occur when the chamber has been idle for sometime, in-between the processing of different lots of substrates, or when different types of processes have been performed in the chamber. It is believed that such processing variations often arise due to differences in the processing environment in the chamber that occurs during processing of the first few substrates and the subsequently processed substrates. The processing environment may be different due to differences in the surface chemistry of the internal chamber surfaces. For example, when process residues are formed on the chamber surfaces, the composition of the process residues may affect the partial pressures of the gaseous species in the chamber as a result of chemical equilibrium between the gaseous species and the process residue. The partial pressure of gaseous species in the chamber, in turn, affect the processing characteristics of the substrates being processed in the chamber. For example, in etching processes, variations in the internal chamber environment between one substrate and another, can result in variations of the critical dimensions of etched features between the first few and subsequently processed substrates.

The substrate to substrate processing variations may be reduced by "seasoning" the chamber before processing of production substrates. In one seasoning process, a number of seasoning or dummy substrates, such as bare silicon substrates, are processed in the chamber until the chamber yields consistent processing results. Consistent processing results may occur after a few or a large number of dummy substrates are processed in the chamber. Thus, the seasoning process is typically optimized by empirical tests to determine the number of substrates that need to be processed in the chamber to yield consistent processing characteristics. However, these empirical tests are laborious and need to be reevaluated each time any process parameter is changed.

Thus, it is desirable to process substrates with uniform and consistent processing results. It is also desirable to evaluate the condition of a chamber before processing production substrates in the chamber. It is further desirable to season a chamber to provide consistent processing results for a series of substrates in a lot. It is further desirable to reduce the need for empirical seasoning measurements and processes.

SUMMARY

A substrate processing apparatus comprising: a chamber comprising a substrate support to support a substrate, a gas supply to provide a gas into the chamber, a gas energizer to energize the gas, and an exhaust to exhaust the gas; a substrate transport to transport a substrate onto the substrate support in the chamber; a detector adapted to detect a first intensity of a first wavelength of a radiation emission from the energized gas in the chamber and generate a first signal in relation to the first intensity and detect a second intensity of a second wavelength of the radiation emission and generate a second signal in relation to the second intensity; and a controller adapted to (i) receive the first and second signals from the detector, (ii) perform a mathematical operation on the first and second signals to determine a value related to a condition of the chamber, and (iii) treat the chamber in relation to the value by providing instructions to operate one or more of the substrate transport, substrate support, gas supply, gas energizer and exhaust.

A method of treating a substrate processing chamber, the method comprising: (a) providing an energized gas in the chamber; (b) detecting a first intensity of a first wavelength of a radiation emission from the energized gas and generating a first signal in relation to the first intensity; (c) detecting a second intensity of a second wavelength of the radiation emission and generating a second signal in relation to the second intensity; (d) performing a mathematical operation on the first and second signals to determine a value related to a condition of the chamber; and (e) treating the chamber in relation to the value.

A substrate processing apparatus comprising: a chamber comprising a substrate support to support a substrate, a gas supply to provide a gas into the chamber, a gas energizer to energize the gas, and an exhaust to exhaust the gas; a substrate transport to transport a substrate onto the substrate support in the chamber; a detector adapted to detect a first intensity of a first wavelength of a radiation emission from the energized gas in the chamber and generate a first signal in relation to the first intensity and detect a second intensity of a second wavelength of the radiation emission and generate a second signal in relation to the second intensity; and a controller adapted to (i) determine a chamber condition by receiving the first and second signals from the detector and performing a mathematical operation on the first and second signals to determine a value related to a ratio of the first and second signals, (ii) treat the chamber until the value falls within a range of predetermined values by providing first instructions to operate one or more of the substrate transport, substrate support, gas supply, gas energizer, and exhaust, and (iii) etch one or more substrates in the chamber by providing second instructions to operate one or more of the substrate transport, substrate support, gas supply, gas energizer, and exhaust.

A method of processing a substrate in a chamber, the method comprising: (a) in a chamber evaluation stage, detecting a first intensity of a first wavelength of a radiation emission from an energized gas in a chamber and generating a first signal in relation to the first intensity and detecting a second intensity of a second wavelength of the radiation emission and generating a second signal in relation to the second intensity and performing a mathematical operation on the first and second signals to determine a value related to a ratio of the first intensity to the second intensity; (b) in a chamber treatment stage, treating the chamber until the evaluated value is within a range of predetermined values; and (c) in a substrate etching stage, providing a substrate in the chamber, introducing a gas into the chamber, energizing the gas, and exhausting the gas.

A substrate processing apparatus comprising: a chamber comprising a substrate support to support a substrate, a gas supply to provide a gas into the chamber, a gas energizer to energize the gas, and an exhaust to exhaust the gas; a substrate transport to transport a substrate onto the substrate support in the chamber; a detector adapted to detect a first intensity of a first wavelength of a radiation emission from energized carbon containing species in the chamber and generate a signal in relation to the first intensity and detect a second intensity of a second wavelength of a radiation emission from energized silicon containing species in the chamber and generate a second signal in relation to the second intensity; and a controller adapted to provide instructions to operate one or more of the substrate transport, substrate support, gas supply, gas energizer, and exhaust, to: (i) determine a chamber condition by receiving the first and second signals from the detector and performing a mathematical operation to determine a value related to a ratio of the first intensity to the second intensity, (ii) treat the chamber until the evaluated value falls within a range of predetermined values by providing first instructions to operate one or more of the substrate transport, substrate support, gas supply, gas energizer, and exhaust, to transport one or more first substrates comprising carbon species or silicon species into the chamber, introduce gas into the chamber, energize the gas, and exhaust the gas, and (ii) etch one or more second substrates in the chamber by providing second instructions to operate one or more of the substrate transport, substrate support, gas supply, gas energizer, and exhaust.

A method of processing a substrate in a chamber, the method comprising: (a) in a chamber evaluation stage, detecting a first intensity of a first wavelength of a radiation emission from energized carbon containing species in the chamber and generating a first signal in relation to the first intensity and detecting a second intensity of a second wavelength of radiation emissions from energized silicon containing species in the chamber and generating a second signal in relation to the second intensity and performing a mathematical operation to determine a value related to a ratio of the first intensity to the second intensity; (b) in a chamber treatment stage, treating the chamber until the evaluated value is within a range of predetermined values by providing one or more first substrates comprising carbon containing species or silicon containing species in the chamber, introducing a gas into the chamber, energizing the gas, and exhausting the gas; and (c) in a substrate etching stage, providing one or more second substrates in the chamber, introducing a gas into the chamber, energizing the gas, and exhausting the gas.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

Figure 1:
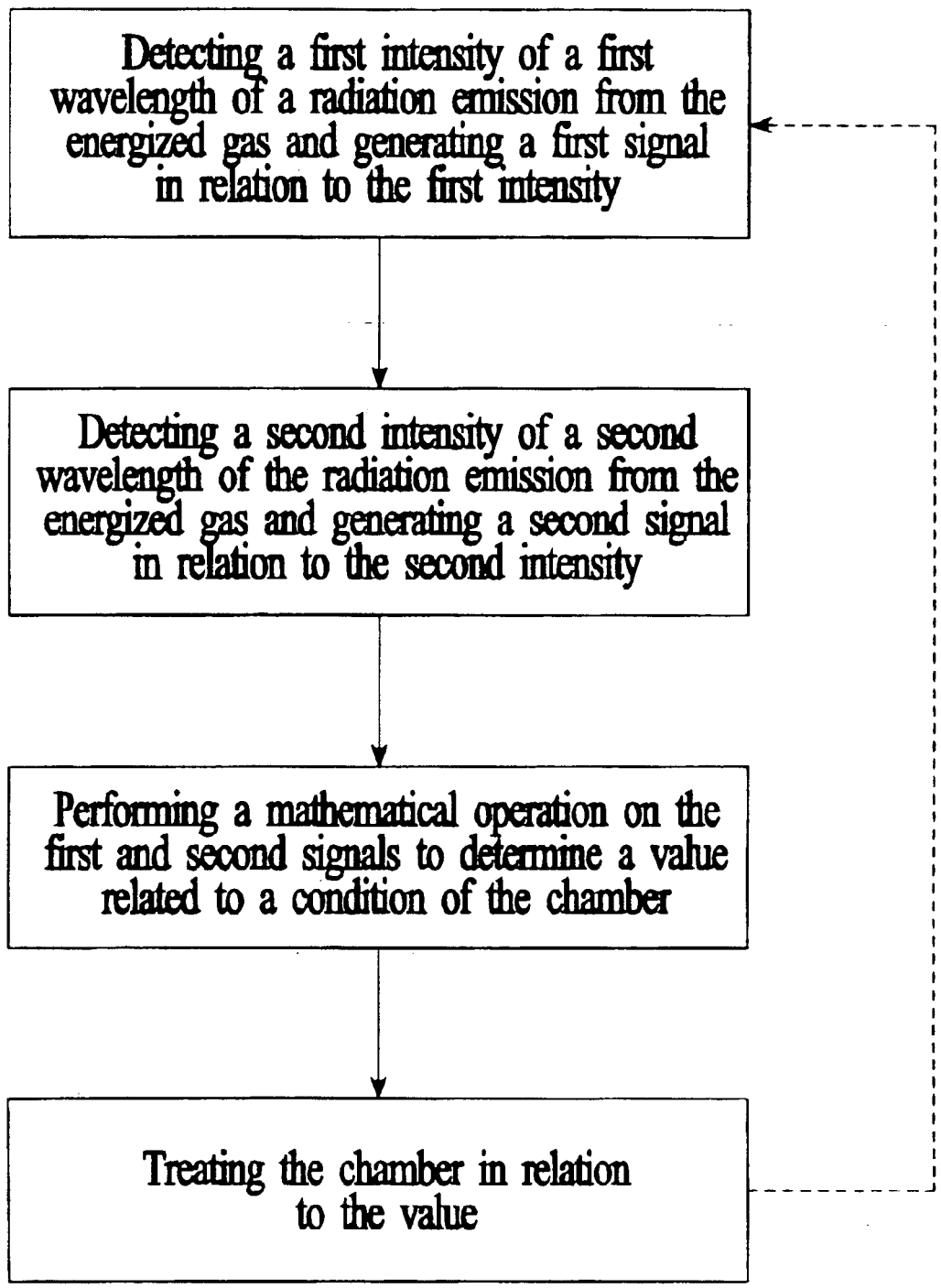
FIG. 1 is a flow chart illustrating a chamber treatment method according to an embodiment of the present invention.

The present apparatus and method allows an operator to evaluate the condition of a substrate processing chamber prior to the processing of production substrates in the chamber. The chamber condition reflects the "seasoning state" of the chamber and provides an indication of the state of the chamber that affects the uniformity of processing of substrates in the chamber. Typically, it is desirable to obtain a predefined "seasoned" chamber condition that yields uniform and consistent processing results for the production substrates before any production substrates are processed in the chamber. The seasoned chamber condition reduces the possibility of processing variations in the processing of a batch of substrates. The seasoning state of a chamber is often dependent upon the composition and distribution of process residues across the internal chamber surfaces. These residues affect the vapor pressure of the gaseous species present in energized gas in the chamber, which in turn, affect the processing characteristics of the substrates being processed in the chamber. For example, in the etching of production substrates in a chamber, the composition of the process residues formed on the chamber surfaces affects the vapor pressure of carbon and other species that typically deposit as sidewall passivating polymer on the sidewalls of the freshly etched features, thereby influencing the shape or dimensions of the etched features. A chamber in a "good" seasoning condition allows etching of the substrates with consistent shapes and dimensions of the etched features.

According to an embodiment of the present invention, the chamber seasoning condition is evaluated by detecting radiation emissions from an energized gas in a chamber. The energized gas may be a gas energized to process a substrate or some other gas that is used to treat the chamber. The gas may be energized by coupling RF energy to the gas to form a plasma of the gas (as shown), or by coupling microwave energy to the gas in a remote chamber to activate the gas by dissociation (not shown). The energized gas emits radiation in the infra-red, ultraviolet or visible spectrum, and which is detectable. This radiation emission is detected and used in a chamber evaluation step to evaluate the condition of the internal chamber surfaces.

In one exemplary embodiment, the condition or state of seasoning of the chamber is evaluated by detecting the intensity of a plurality of wavelengths of a radiation emission from the energized gas in the chamber. It is believed that the intensity of the wavelengths of the radiation emission from the energized gas are affected by the type or composition of the process residues formed on the internal chamber surfaces, which in turn affects the chamber condition. Thus, the chamber condition is evaluated by detecting radiation emissions that arise from chemical species which are present in the process residues that form on the chamber surfaces or present in the energized gas in the chamber 106. For example, when process residues predominantly composed of carbon and silicon species, such as for example CN or SiF, are formed on the chamber walls, the intensities of the wavelengths of radiation emissions of the energized gas in the chamber that arise from the presence of the carbon or silicon species in the energized gas, may be detected to determine the seasoning state of the chamber.

The chamber condition is evaluated by performing a mathematical operation on one or more signals generated in relation to the detected intensities to determine a value related to the seasoning condition of the chamber. For example, the signals relating to the detected intensities may be subtracted from one another, added to one another, multiplied by one another, or divided by one another. The signals may also be used in a predefined or calculated mathematical equation to determine the chamber condition. In one embodiment, as illustrated in FIG. 1, the chamber condition is determined by performing an operation on the signals to determine a value that is related to a ratio of the detected intensities of the wavelengths emitted from the energized gas in the chamber. For example, the value may be a first intensity of a first detected wavelength of the radiation emissions divided by a second intensity of a second wavelength. In an exemplary version, when process residues deposited on the chamber surfaces are predominantly composed of carbon and silicon species, signals related to the detected intensities of wavelengths of the radiation emission that relates to the presence of energized carbon and silicon containing species are generated, and the ratio of the signals may be evaluated to determine a value corresponding to the condition of the chamber. The ratio may be obtained, by for example, dividing the intensity of a first signal related to the first intensity of a first wavelength of radiation emission arising from the presence of carbon containing species in the process residues by the intensity of a second signal related to a second intensity of a second wavelength of the radiation emission that arises from the presence of silicon containing species in the process residues. By evaluating this ratio, the presence of the relative amounts of these species in the energized gas—which may also indicate the presence of these species in process residues on the internal chamber surfaces—may be evaluated to determine the chamber condition and processing environment.

In a further step, the value obtained by performing the operation may be compared to a range of predetermined values to determine the seasoning state and condition of the chamber. The range of predetermined values may be a range of values that have been previously determined to occur when the chamber is providing consistent substrate processing results, and that are for the same wavelengths of radiation emissions as those detected and evaluated. The predetermined range of values may be centered about a set-point that is detected when chamber conditions have been stabilized in the processing of multiple substrates. Thus the range of predetermined values depends upon the selected radiation wavelengths, and their evaluation method, the types of process performed in the chamber, and also upon the steady state equilibrium conditions of the chemical species present in the energized gas in the chamber and perhaps on the internal surfaces in the chamber.

The present method may be used to dynamically monitor the condition of the chamber in the processing of substrates in the chamber. For example, the monitoring method may be used to evaluate the condition of the chamber while a substrate is being processed in the chamber, and when the chamber condition deviates from a predetermined chamber condition, execute a self-correcting action to return the chamber condition to the predetermined state. The self-correcting action may be, for example, treating the chamber by introducing a gas into the chamber and energizing the gas. For example, a gas comprising oxygen may be introduced into the chamber and energized to clean off excess process residues that alter the environment in the chamber. As another example, the evaluation process may be conducted after a set number of substrates are processed in the chamber, and a chamber treatment process performed to return the chamber to a predefined state. The evaluation process may also be conducted after operation of the chamber has been interrupted, when a different series of substrates is to be processed in the chamber, or when a different process is to be conducted in the chamber.

The present method may also be used to monitor the condition of the chamber during treatment of the chamber by a chamber seasoning process. When the value obtained by performing an operation on the signals is lower or higher than the range of predetermined values, this indicates that the chamber has not yet been properly seasoned, and the internal chamber environment will not yet provide uniform processing results in the processing of a batch of substrates. Thus, after the condition of the chamber is evaluated, the chamber may be treated in a chamber treatment process stage, to generate conditions in the chamber that properly season the internal surfaces in the chamber. For example, the chamber may be treated until the value of the operation performed on the signals is within a range of predetermined values. Thus, conditions suitable for the uniform processing of substrates may be obtained by applying a closed loop process comprising detecting a first intensity of a first wavelength and a second intensity of a second wavelength related to the radiation emissions and generating a first signal in relation to the first intensity and a second signal in relation to the second intensity, performing an operation on the first and second signals to determine a value related to a condition of the chamber and comparing the value to a predetermined value, and treating the chamber until the evaluated value of the detected radiation emissions is within a range of predetermined values, as for example, illustrated in FIG. 1. This closed loop control system is advantageous because it reduces an operator's reliance on empirical tests to determine the optimal number of substrates or optimal chamber seasoning conditions. It also allows at least partial automation of the chamber treatment and evaluation process.

In the chamber treatment process, the chamber may be treated until the chamber exhibits consistent processing results. The chamber treatment process may process substrates which are production substrates or dummy treatment substrates. The substrates and processing conditions are selected to regulate the composition or quantity of process residues formed on the chamber surfaces, for example, by generating, changing or cleaning process residues formed on internal chamber surfaces. In a typical chamber treatment process, one or more treatment substrates is sequentially placed in the chamber and processed with an energized gas, to treat the chamber. The energized gas is formed by introducing a gas into the chamber and energizing the gas by coupling RF or microwave power to the gas. Process residue comprising chemical species originating from the energized gas or formed in the reaction of the energized gas with the treatment substrate deposit on surfaces of the chamber to treat and condition the chamber.

In one version, a treatment substrate comprising silicon is processed to generate process residues comprising silicon species on internal surfaces in the chamber. As another example, a substrate comprising a resist material, such as organic photoresist, may be processed to generate process residues comprising carbon species on internal surfaces in the chamber. Different types of substrates, for example, one or more first substrates comprising a first material, and one or more second substrates comprising a second material, may also be sequentially processed in the chamber to affect the nature of the process residues formed on the chamber surfaces. For example, to deposit process residues that predominantly comprise carbon and silicon species on the chamber surfaces, the treatment substrates may comprise for example silicon or photoresist materials, which are sequentially processed to generate the carbon and silicon species containing process residues. The substrates may also be processed to remove process residues from the chamber by chemically combining the process residues or other species in the chamber to form volatile compounds.

The treatment substrates are typically processed by introducing a gas into the chamber and energizing the gas to form or remove process residues in the chamber to season the chamber. For example, the gas may comprise an etchant gas comprising a fluorine containing gas, such as $CF_4$, that is capable of being energized to etch a carbon containing substrate in the chamber to generate process residue comprising carbon containing species. As yet another example, an etchant gas comprising a chlorine or bromine containing gas, such as $Cl_2$ or HBr, may be energized to etch a substrate comprising silicon and photoresist to generate process residue comprising silicon containing and carbon containing species in the chamber. The process residues deposit on the internal chamber surfaces to season the chamber. As another example, the gas may comprise an etchant gas comprising $O_2$ that may be energized to etch a substrate and remove process residues comprising carbon containing species in the chamber. The $O_2$ gas removes the carbon containing species by forming volatile compounds, such as CO, which are exhausted from the chamber. Thus, the gas is selected to process the substrates and provide the desired composition of process residues on the chamber surfaces that are suitable to provide consistency in the processing of substrates in the chamber.

The duration of the chamber treatment process, or individual steps of the treatment process, may also be controlled to provide the desired chamber conditions. For example the duration of a step of a treatment process in which $O_2$ gas is energized in the chamber may be increased to remove more carbon containing species, or may be decreased to remove less carbon containing species, thereby changing the seasoning state of the chamber. Similarly, the gas energizing process conditions, such as the RF or microwave power applied to the gas may also be selected to achieve the desired results.

After the chamber is seasoned to satisfaction, a production process may be implemented in the chamber to process one or more substrates. The production process may be a substrate etching process, a deposition process for depositing material on the substrate for example, by chemical or physical vapor deposition, or an ion implantation process, or any other process used in the fabrication of substrates. In the production process, a process gas is introduced into the chamber and energized to process the production substrate. For example, in a typical deposition process, a deposition gas comprising one or more of $SiH_4$, $SiClH_2$, $CO_2$, $H_2$, $N_2O$, $Si(OC_2H_5)_4$, $NH_3$ and $N_2$ may be introduced into the chamber and energized to deposit an insulator or dielectric material, such as for example, $SiO_2$ or $Si_3N_4$, on a production substrate. Alternatively, a metal-containing material, such as a tungsten-containing material may be deposited on the production substrate by introducing, for example, a deposition gas comprising one or more of $WF_6$, $H_2$ and $SiH_4$ and energizing the deposition gas. In a typical etch process, an etchant gas comprising, for example, one or more halogen containing gases, such as $CF_4$, $Cl_2$, and HBr, or one or more oxygen containing gases, such as $O_2$, is introduced into the chamber and energized to etch a material or layer on the production substrate. The material or layer may comprise, for example, a dielectric material, such as a silicon or SiON, or a metal-containing material, such as tungsten or tungsten silicide. Upon completion of the production process, the production substrate is removed and another production substrate may be provided in the chamber for processing.

Figure 2:
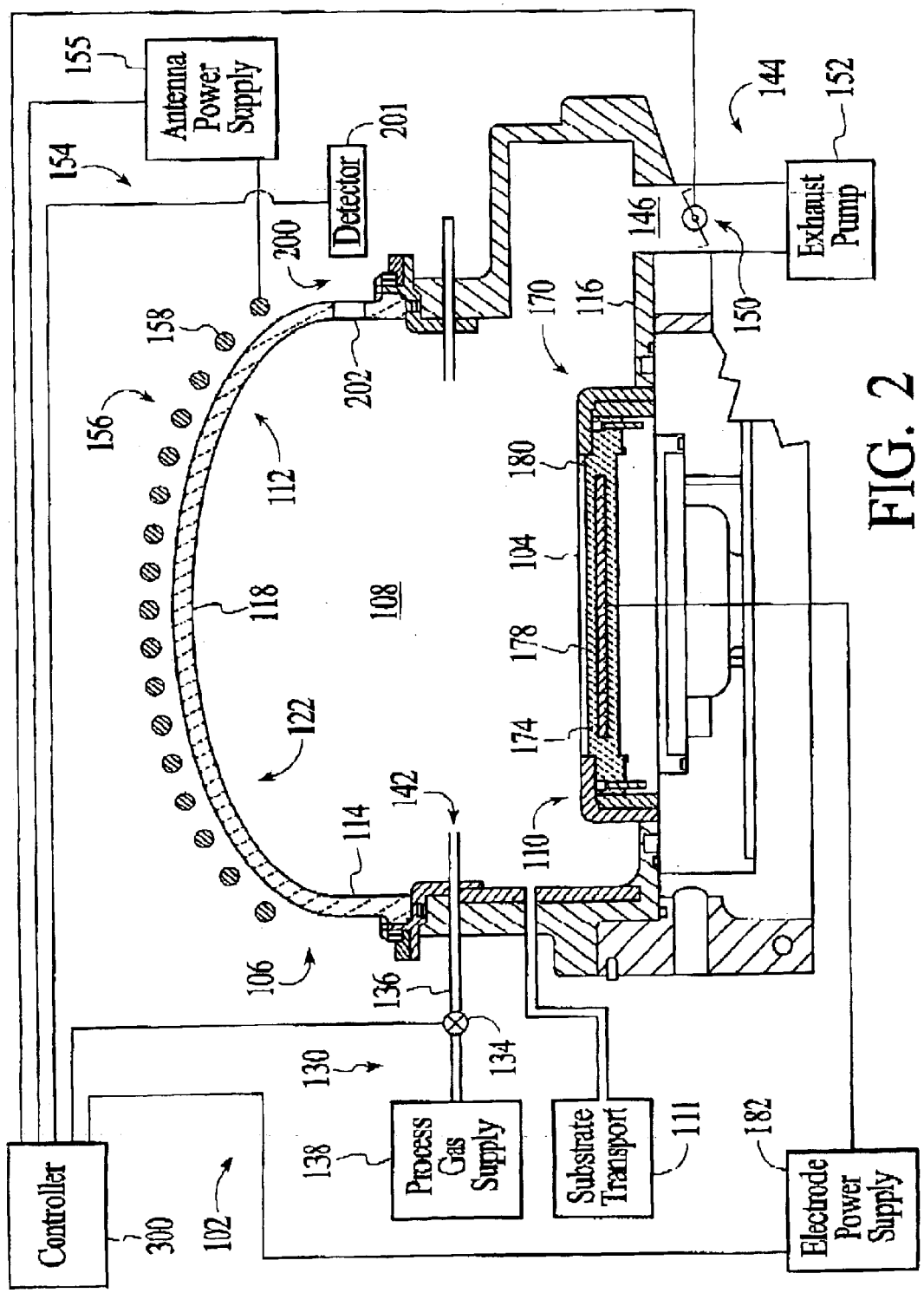
FIG. 2 is a schematic sectional side view of an exemplary process chamber according to an embodiment of the present invention.

An exemplary apparatus 102 suitable for processing substrates 104 comprises a process chamber 106 as schematically illustrated in FIG. 2. The particular embodiment of the apparatus 102 is suitable for processing substrates 104, such as semiconductor substrates, and may be adapted by those of ordinary skill to process other substrates 104, such as flat panel displays or circuit panels. The apparatus 102 is provided only to illustrate the invention, and should not be used to limit the scope of the invention or its equivalents to the exemplary embodiments provided herein. Generally, the apparatus 102 comprises an chamber 106 comprising walls typically fabricated from metal or ceramic materials. In the embodiment shown, the chamber 106 comprises a wall 122 which may comprise sidewalls 114, a bottom wall 116, and a ceiling 118. The ceiling 118 may comprise a substantially arcuate shape, or in other versions, the ceiling 118 may comprise a dome, substantially flat, or multi-radius shaped portion. The chamber 106 typically comprises an internal substrate processing volume of at least about 5,000 $cm^3$ and more typically from about 10,000 to about 50,000 $cm^3$.

In operation, a gas supply 130 provides process gas into the chamber 106 from a process gas source 138. The gas supply 130 comprises a gas conduit 136 connected to the process gas source 138 and having one or more flow control valves 134 that may be used to control the flow of process gas passing through the conduit 136. The conduit 136 terminates in one or more gas inlets 142 in the chamber 106. Spent process gas and etchant byproducts are exhausted from the chamber 106 through an exhaust 144 which includes a pumping channel 146 that receives spent process gas, a throttle valve 150 to control the pressure of process gas in the chamber 106, and one or more exhaust pumps 152. The exhaust 144 may also contain an abatement system for abating undesirable gases from the exhaust.

The process gas is energized to process the substrate 104 by a gas energizer 154 that couples energy to the process gas in the process zone 108 of the chamber 106 (as shown) or in a remote zone upstream from the chamber 106 (not shown). In one version, the gas energizer 154 comprises an antenna 156 comprising one or more inductor coils 158 which may have a circular symmetry about the center of the chamber

106. Typically, the antenna 156 comprises solenoids having from about 1 to about 20 turns. A suitable arrangement of solenoids is selected to provide a strong inductive flux linkage and coupling to the process gas. When the antenna 156 is positioned near the ceiling 118 of the chamber 106, the adjacent portion of the ceiling may be made from a dielectric material, such as silicon dioxide, which is transparent to RF or electromagnetic fields. An antenna power supply 155 provides, for example, RF power to the antenna 156 at a frequency of typically about 50 KHz to about 60 MHz, and more typically about 13.56 MHz; and at a power level of from about 100 to about 5000 Watts. An RF match network (not shown) may also be provided. Alternatively or additionally, the gas energizer 154 may comprise a microwave or an "up-stream" gas activator (not shown).

In one version, the gas energizer 154 may also or alternatively comprise process electrodes 112, 178 that may be used to energize the process gas. Typically, the process electrodes 112, 178 include one electrode 112 in a sidewall 114 or ceiling 118 of the chamber 106 that is capacitively coupled to another electrode, such as an electrode 178 in the support 110 below the substrate 104. When the ceiling 118 also serves as an electrode 112, the ceiling 118 may comprise a dielectric material that serves as an induction field transmitting window that provides a low impedance to an RF induction field transmitted by the antenna 156 above the ceiling 118. Suitable dielectric materials that can be employed include materials such as aluminum oxide or silicon dioxide. Generally, the electrodes 112, 178 may be electrically biased relative to one another by an electrode voltage supply (not shown) that includes an AC voltage supply for providing an RF bias voltage. The RF bias voltage may comprise frequencies of about 50 kHz to about 60 MHz, and the power level of the RF bias current is typically from about 50 to about 3000 watts.

In operation, a substrate transport 111, such as for example a robotic arm (not shown) transports a substrate 104 onto the substrate support 110 in the chamber 106. The substrate 104 is typically received on lift pins (not shown) that extend out of the substrate support 110 to receive the substrate 104 and retract back into the substrate support 110 to deposit the substrate 104 on the support 110. The substrate support 110 may comprise an electrostatic chuck 170 which comprises a dielectric body 174 which at least partially covers the electrode 178 and which may include a substrate receiving surface 180. The electrode 178 may also serve as one of the process electrodes discussed above. The electrode 178 may be capable of generating an electrostatic charge for electrostatically holding the substrate 104 to the support 110 or electrostatic chuck 170. A power supply 182 provides the electrostatic chucking voltage to the electrode 178.

The apparatus 102 further comprises one or more detectors 200 that are adapted to detect the intensities of one or more wavelengths of the radiation emission and generate one or more signals in relation to the detected intensities. A suitable detector 200 comprises a sensor 201, such as for example, a photomultiplier tube, spectrometer, charge coupled device, or photodiode. The detector 200 is typically positioned to detect the radiation emission from an energized gas in the chamber 106. For example, the detector 200 may be positioned to detect radiation passing through a window 202 formed in a wall of the chamber 106 that is permeable to radiation of the desired wavelengths. The detector 200 operates to detect the intensities of the wavelengths of radiation emission that are suitable to determine the chamber treatment or processing conditions in the chamber 106. For example, the detector 200 may be capable of detecting the intensities of radiation emissions resulting from the presence of carbon or silicon containing species in the chamber 106. Such radiation emissions are typically in the wavelength range of from about 3500 Å to about 4500 Å, and more typically from about 2000 Å to about 8000 Å.

Once the intensities of the one or more wavelengths of the radiation emission are detected, the detector 200 generates one or more signals related to the detected intensities that is sent to a chamber controller 300. The detector 200 may generate a signal that is a single value representative of a single detected wavelength or that is derived from a combination of the detected intensities, or may generate a number of signals related to different detected wavelength intensities. In one version, the detector 200 generates a first signal related to a first intensity of a first wavelength of the radiation emission and a second signal related to a second intensity of a second wavelength of the radiation emission. In one version, the detector 200 is capable of detecting an absolute intensity of a wavelength of the radiation emission. Detecting the absolute intensity allows the intensities of the wavelength of the radiation emission before and after treatment of the chamber 106 to be compared. When a sensor 201 comprising a photomultiplier tube is used to detect such an absolute intensity of a wavelength of the radiation emission, the gain level of the photomultiplier tube level may be fixed so the absolute intensity of the radiation emission is detected.

Figure 3:
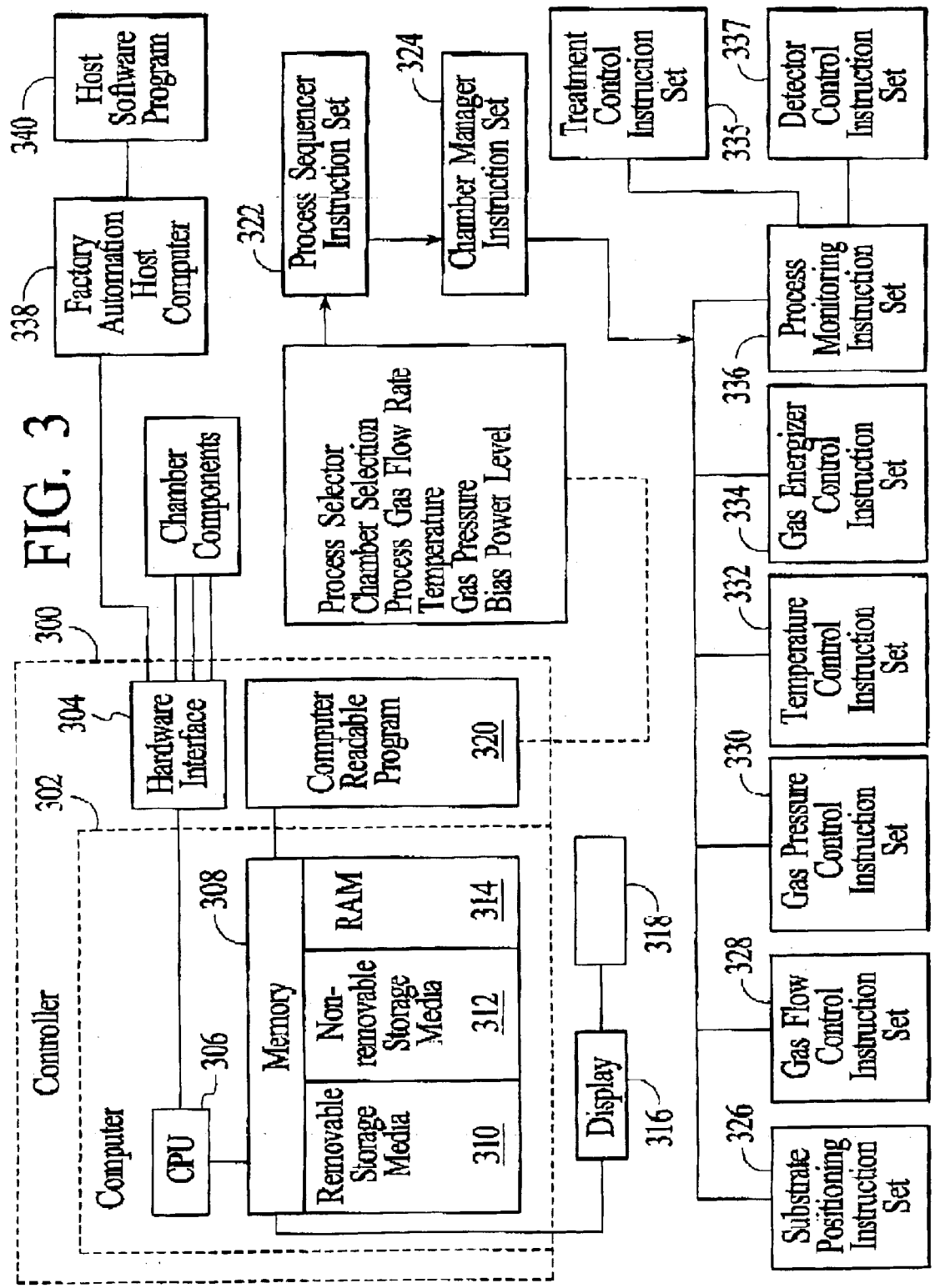
FIG. 3 is an illustrative block diagram of a version of a controller and a computer readable program, according to an embodiment of the present invention.

The chamber 106 is operated by the controller 300 via a hardware interface 304. The controller 300 providing instructions to operate one or more of the substrate transport, gas supply, gas energizer and gas exhaust. The controller 300 may comprise a computer 302 which may comprise a central processor unit (CPU) 306, such as for example a 68040 microprocessor, commercially available from Synergy Microsystems, California, or a Pentium Processor commercially available from Intel Corporation, Santa Clara, Calif., that is coupled to a memory 308 and peripheral computer components, as shown in FIG. 3. Preferably, the memory 308 may include a removable storage media 310, such as for example a CD or floppy drive, a non-removable storage media 312, such as for example a hard drive, and random access memory 314. The controller 300 may further comprise a plurality of interface cards including, for example, analog and digital input and output boards, interface boards, and motor controller boards. The interface between an operator and the controller 300 can be, for example, via a display 316 and a light pen 318. The light pen 318 detects light emitted by the monitor display 316 with a light sensor in the tip of the light pen 318. To select a particular screen or function, the operator touches a designated area of a screen on the monitor 316 and pushes the button on the light pen 318. Typically, the area touched changes color, or a new menu is displayed, confirming communication between the user and the controller 300.

The data signals received by and/or evaluated by the controller 300 may be sent to the factory automation host computer 338. The factory automation host computer 318 may comprise a host software program 340 that evaluates data from several systems, platforms or chambers 106, and for batches of substrates 104 or over an extended period of time, to identify statistical process control parameters of (i) the processes conducted on the substrates 104, (ii) a property that may vary in a statistical relationship across a single substrate 104, or (iii) a property that may vary in a statistical relationship across a batch of substrates 104. The host software program 340 may also use the data for ongoing in-situ process evaluations or for the control of other process parameters. A suitable host software program comprises a WORKSTREAM™ software program available from aforementioned Applied Materials. The factory automation host computer 338 may be further adapted to provide instruction signals to (i) remove particular substrates 104 from the processing sequence, for example, if a substrate property is inadequate or does not fall within a statistically determined range of values, or if a process parameter deviates from an acceptable range; (ii) end processing in a particular chamber 106, or (iii) adjust process conditions upon a determination of an unsuitable property of the substrate 104 or process parameter. The factory automation host computer 338 may also provide the instruction signal at the beginning or end of processing of the substrate 104 in response to evaluation of the data by the host software program 340.

In one version the controller 300 comprises a computer-readable program 320 that may be stored in the memory 308, for example on the non-removable storage media 312 or on the removable storage media 310. The computer readable program 320 generally comprises process control software comprising program code to operate the chamber 106 and its components, process monitoring software to monitor the processes being performed in the chamber 106, safety systems software, and other control software. The computer-readable program 320 may be written in any conventional computer-readable programming language, such as for example, assembly language, C++, Pascal, or Fortran. Suitable program code is entered into a single file, or multiple files, using a conventional text editor and stored or embodied in computer-usable medium of the memory 308. If the entered code text is in a high level language, the code is compiled, and the resultant compiler code is then linked with an object code of precompiled library routines. To execute the linked, compiled object code, the user invokes the object code, causing the CPU 306 to read and execute the code to perform the tasks identified in the program.

Using an input device, such as a light pen interface, a user enters a process set and chamber number into the computer readable program 320 in response to menus or screens displayed on the CRT terminal. The computer readable program includes program code to control the substrate position, gas flow, gas pressure, temperature, RF power levels, and other parameters of a particular process, as well as code to monitor the chamber process. The process sets are predetermined groups of process parameters necessary to carry out specified processes. The process parameters are process conditions, including without limitations, gas composition, gas flow rates, temperature, pressure, and gas energizer settings such as RF or microwave power levels.

The process sequencer instruction set 322 comprises program code to accept a chamber type and set of process parameters from the computer readable program 320 and to control its operation. The sequencer program 322 initiates execution of the process set by passing the particular process parameters to a chamber manager instruction set 324 that controls multiple processing tasks in the process chamber 106 by providing instructions to operate one or more of the substrate transport, gas supply, gas energizer and gas exhaust. Typically, the process chamber instruction set 324 includes a substrate positioning instruction set 326, a gas flow control instruction set 328, a gas pressure control instruction set 330, a temperature control instruction set 332, a gas energizer control instruction set 334, and a process monitoring instruction set 336. Typically, the substrate positioning instruction set 326 comprises program code for controlling chamber components that are used to load the substrate 104 onto the support 110 and optionally, to lift the substrate 104 to a desired height in the chamber 106. The gas flow control instruction set 328 comprises program code for controlling the flow rates of different constituents of the process gas. The gas flow control instruction set 328 regulates the opening size of the gas flow meter 134 to obtain the desired gas flow rate into the chamber 106. The gas pressure control instruction set 330 comprises program code for controlling the pressure in the chamber 106 by regulating open/close position of the throttle valve 150. The gas energizer control instruction set 332 comprises program code for setting RF bias power levels applied to, for example, the antenna 156

The process monitoring instruction set 334 comprises code for monitoring the process in the chamber 106. In one version, the process monitoring instruction set 334 may comprise a detector control instruction set 337 to communicate with the detector 200. For example, the detector control instruction set 337 may comprise code to process one or more signals related to the intensities of the plurality of wavelengths of the radiation emission received from the detector 200. The detector control instruction set 337 contained in the controller 300 may process the signals to obtain, for example, the intensities of the one or more wavelengths of the radiation emission as a function of time. The detector control instruction set 337 may also perform an operation on the signals to determine a value related to the seasoning condition of the chamber. For example, the detector control instruction set 337 may perform an operation to determine a value that is related to a ratio of a first intensity of a first wavelength of the radiation emission to a second intensity of a second wavelength of the radiation emission.

In one version, the process monitoring instruction set 336 also comprises a treatment control instruction set 335 that includes program code to compare a value obtained by performing an operation on the one or more signals to a predetermined value, and to treat the process chamber 106 until the value is substantially within a range of predetermined values. In one version, the treatment control instruction set 335 may comprise program code to operate the chamber components to process one or more substrates 104 in the chamber 106 until the value is within the range of predetermined values. For example, the treatment control instruction set 335 may comprise code to treat the chamber by providing an energized gas in the chamber, or by processing one or more substrates, for example, first substrates comprising a first material, such as silicon, and second substrates comprising a second material, such as photoresist, in an energized gas, until the evaluated ratio of intensities is within the range of predetermined ratios, thereby indicating that the chamber 106 is properly seasoned.

EXAMPLES

The following examples illustrate exemplary methods according to the present invention. While these example demonstrates certain versions, the present invention may be used in other processes, or for other uses, as would be apparent to those of ordinary skill in the art, and the invention should not be limited to the example provided herein. Generally, these examples demonstrate the ability of a treatment process according to the present invention to reduce processing variability in the processing of a batch of substrates 104, and also compare the results obtained in the present process to conventional chamber seasoning processes.

In these examples, a chamber 106 as illustrated in FIG. 2 was treated to season the chamber 106. The chamber 106 was treated by etching a small number of seasoning or treatment substrates 104 according to a selected treatment process. The treatment substrates 104 were either a silicon wafer having a blanket layer of polysilicon thereon, or a silicon wafer having a blanket layer of photoresist, or a number of these substrates 104. The treatment process used to season the chamber 106 was the same process as the etching process used to etch the production substrates 104. The seasoning process was selected to be the same as the etching process to provide substantially similar or the same compositions of process residues on the chamber surfaces. It was believed that selecting the same process would further reduce the process variability in the processing of the production substrates 104.

The process that was used for both chamber treatment and substrate production included a number of separate steps. In the first step, which in the etching of production substrates 104 was performed to etch an antireflective coating (DARC) on the substrate 104, a gas comprising 120 sccm $CF_4$ and 40 sccm Ar was introduced into the chamber 106; the chamber pressure was maintained at 4 mTorr; and the gas was energized by applying an RF power level of 550 Watts to the antenna 156 and 40 Watts to the electrode 178 for the durations given below.

In the next step, gas comprising 25 sccm $CF_4$, 120 sccm HBr, 60 sccm $Cl_2$ and 4.8 sccm $O_2$, was introduced into the chamber 106; the chamber pressure maintained at 4 mTorr; and the gas energized by applying an RF power level of 475 Watts to the antenna 156 and 80 Watts to the electrode 178 for about 55 seconds.

In the subsequent step, gas comprising 165 sccm HBr, 60 sccm $Cl_2$, and 5.4 sccm $O_2$, was introduced into the chamber 106; the chamber pressure was maintained at 9 mTorr; and the gas was energized by applying an RF power level of 335 Watts to the antenna 156 and 100 Watts to the electrode 178 for about 25 seconds.

In the next step, commonly referred to an overetch step, gas comprising 160 sccm HBr and $O_2$, was introduced into the chamber 106 in a volumetric flow ratio and for durations that varied as described in the examples below. In this step, the pressure of the gas was maintained at 55 mTorr, and the gas was energized by applying an RF power level of 750 Watts to the antenna 156 and 100 Watts to the electrode 178.

While the chamber 106 was being seasoned, radiation emissions from the chamber 106 were measured and evaluated to determine the seasoning condition of the chamber 106. When the chamber 106 attained the desired treatment level, the treatment process was stopped, and the seasoned chamber was used to etch a small batch of production substrates 104. The production substrates 104 were silicon wafers having a number of layers, that included from bottom to top, layer of silicon oxide, a layer of polysilicon, a layer of SiON, and an overlying layer of photoresist.

After etching of the production substrates 104, a number of measurements were made on each of the substrates 104 to determine the consistency of the process performed on the different substrates 104. A critical dimension bias (CD bias) of the features etched on substrates 104 were measured to determine the variability in etching from substrate to substrate. For each substrate 104, an average CD bias was calculated by measuring the CD bias at five areas on each substrate 104 using an in-line CD SEM (critical dimension measuring scanning electron microscopy), and thereafter, averaging the measured CD bias measured at each of the five areas of the substrate 104. In addition, the etch rates of features etched on the substrates 104 were also measured with a commercially available spectroscopic probe called OPTIPROBE.

Examples 1–2

Baseline

In these examples, the processing variability that results from one substrate 104 to another, when the chamber 106 is seasoned using a conventional chamber treatment process, was measured.

In Example 1, the chamber 106 was treated by sequentially processing three treatment substrates 104 that each were a silicon wafer covered by a blanket layer of photoresist. The three substrates 104 were processed according to the process described above, but without the overetch step. The first etch step to etch the antireflective coating was performed for 31 seconds. Thereafter, six production substrates 104 were processed using the same process conditions as that used in the chamber treatment process, and the etch rates and CD biases of features etched on the substrates 104 were measured.

Figure 4:
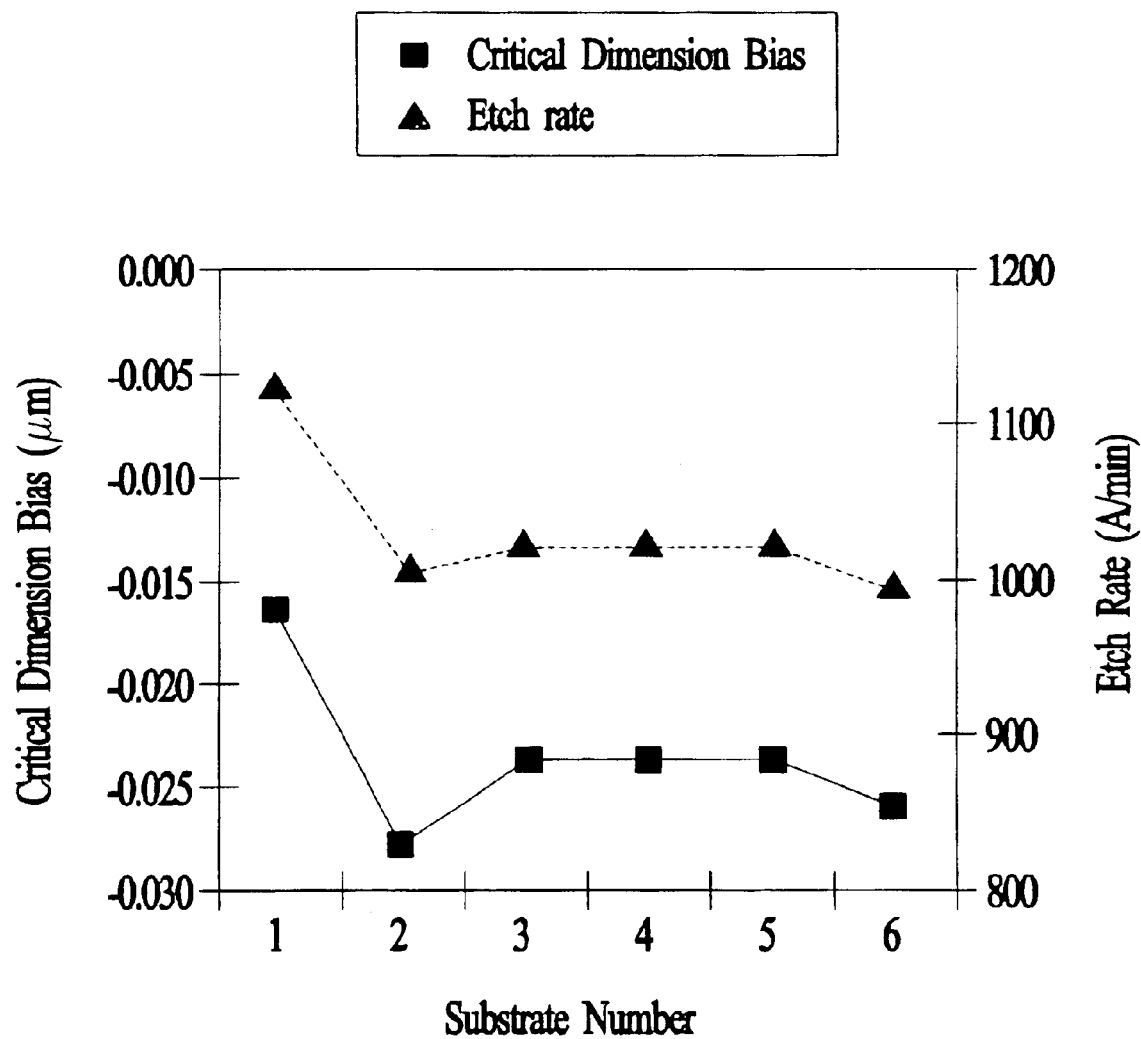
FIG. 4 is a graph of the measured critical dimension biases and etch rates of substrates processed in a chamber after the chamber was treated by processing silicon substrates with photoresist thereon.

FIG. 4 shows the measured etch rates and CD biases of the processed production substrates 104. The first production substrate 104, which was processed immediately after the chamber treatment process, had a substantially higher etch rate and critical dimension bias than the subsequently processed substrates 104. The first substrate 104 exhibited an etch rate of 1130 Å/minute and a critical dimension bias of $-0.005$ $\mu$m. However, after processing of 3 to 4 substrates 104, the subsequently processed substrates 104 demonstrated a stabilized etch rate of 1010 Å/minute and a stabilized critical dimension bias of 0.015 $\mu$m. The processing variability between the first and subsequent substrates 104 is believed to be due to variations in the composition of the process residue present in the chamber 106, which in this case stabilized after the processing of three to four substrates 104. This demonstrates the high substrate processing variability obtained for conventional chamber treatment processes.

Figure 5:
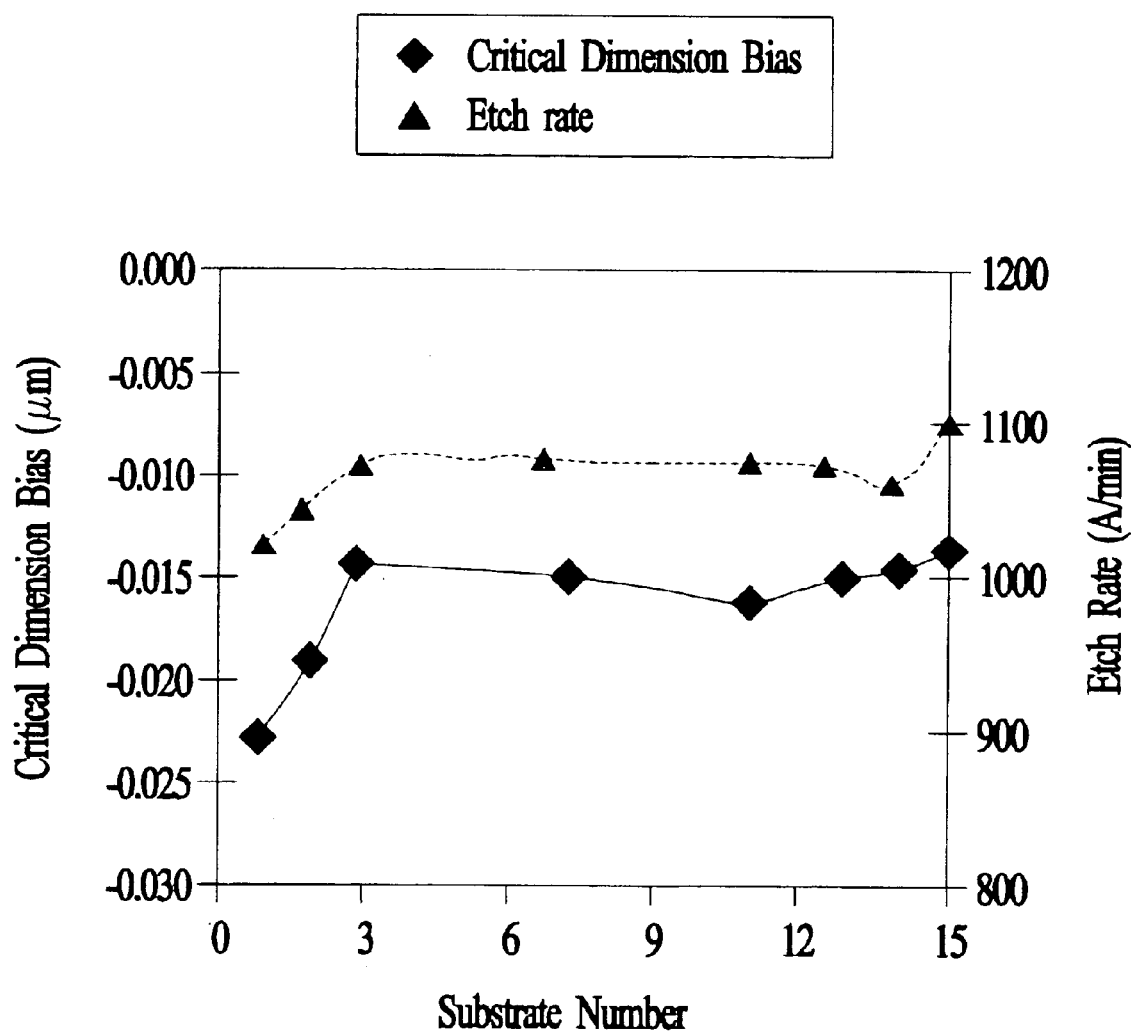
FIG. 5 is a graph of the critical dimension biases and etch rates of substrates processed in a chamber after the chamber was treated by processing bare silicon substrates.

In Example 2, the chamber 106 was treated by sequentially processing three of another type of treatment substrate 104 comprising bare silicon. The treatment substrates 104 were processed according to the etch process given above, but without an overetch step. The first etch step to etch the antireflective coating was performed for 31 seconds. Thereafter, fifteen production substrates 104 were processed and the etch rates and CD biases of features etched on eight of the substrates 104 were measured and shown in FIG. 5. In this example, the first substrate 104 processed after the treatment process had an an etch rate of 900 Å/minute and a critical dimension bias of $-0.023$ $\mu$m, which was substantially lower than the subsequently processed substrates 104 which had an etch rate of Å/minute and a critical dimension bias of $-0.015$ $\mu$m. This example further demonstrates the substrate processing variability obtained between the first few processed substrates 104 and subsequently processed substrates 104.

Examples 3–9

Comparative Chamber Treatment Processes

In Examples 3 through 7, the radiation emissions from the chamber 106 were detected, and the ratio of intensities of the selected wavelengths of the radiation emissions were evaluated for different chamber treatment processes. These examples demonstrate that when the detected ratio of the intensities of selected wavelengths of radiation emissions from the chamber 106 are within a predefined range, the chamber treatment process is highly effective at reducing the substrate processing variability.

In these examples, the predetermined wavelength intensity ratio was obtained by processing multiple substrates 104 with a variety of different processing conditions and monitoring the radiation emission from the energized gas in the chamber 106. It was discovered that the substrates 104 exhibited uniform processing when the ratio of the intensity of a wavelength of the radiation emission corresponding to carbon containing residue at 3860 Å and the intensity of a wavelength of the radiation emission corresponding to silicon containing residue at 4405 Å was in the estimated range of from about 2 to about 4. The chamber treatment processes in which such a ratio of the intensities were detected provided consistent processing of the substrates 104.

Figure 6:
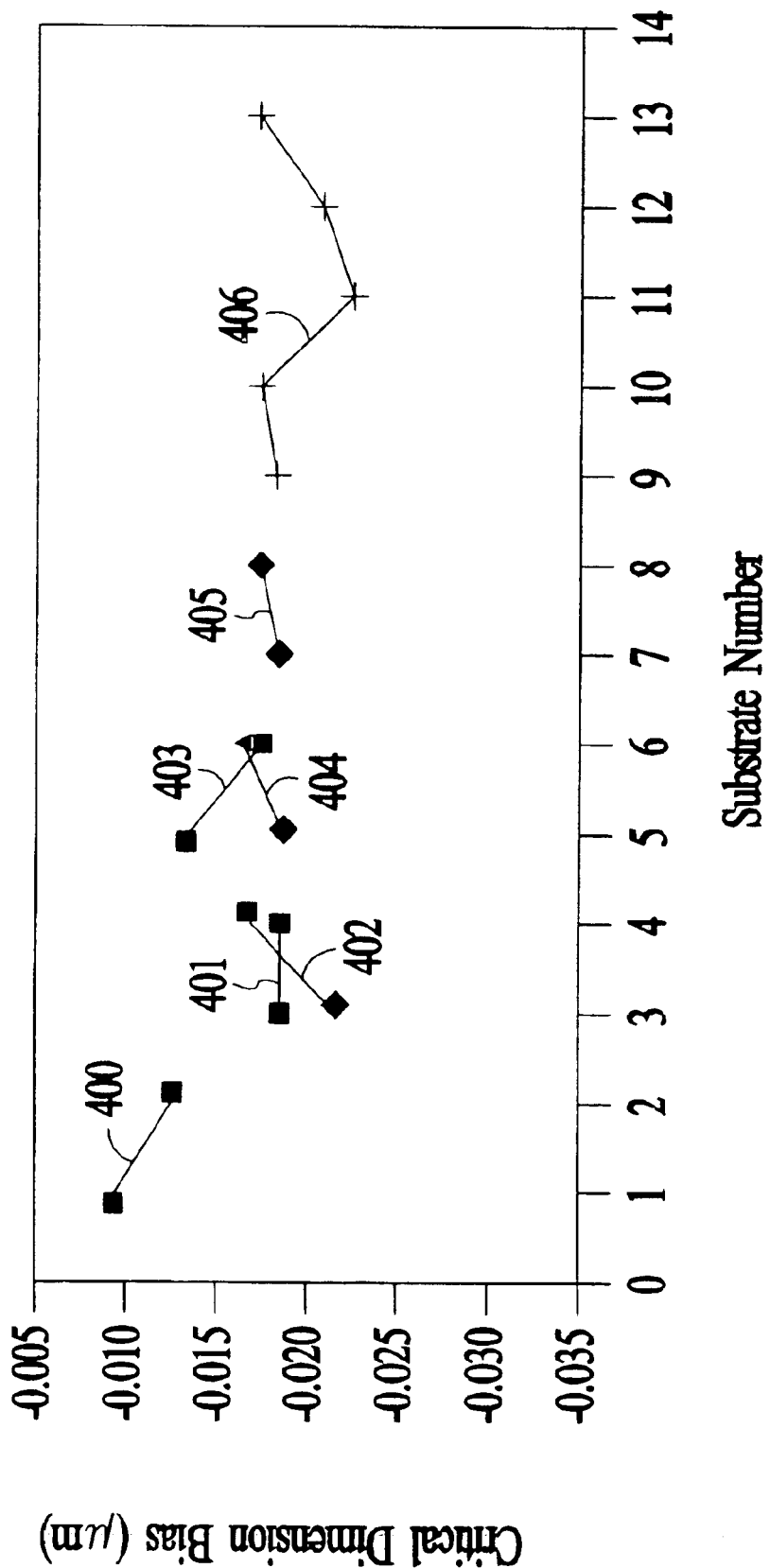
FIG. 6 is a graph of the critical dimension biases of production substrates processed after different types of treatment processes were performed in a chamber.

In Example 3, the chamber 106 was treated by first processing a silicon substrate 104 covered by photoresist in the chamber 106 and then processing a bare silicon substrate 104 in the chamber 106. Both substrates 104 were processed according to the above described process, and the overetch step was performed for 20 seconds and with 5 sccm $O_2$. The first etch step to etch the antireflective coating was performed for 31 seconds. The wavelength intensity ratio of a wavelength relating to carbon species to a wavelength relating to silicon species was measured during processing at about 98, which was outside the desirable range of predetermined ratios. The CD biases for the two production substrates 104 processed after the treatment process, substrates number 1 and 2 on the graph, are connected by line number 400 shown in FIG. 6. FIG. 6 demonstrates that the CD bias for the first substrate 104 processed after the treatment process was substantially higher than that of the second substrate 104. The values of the CD bias were also outside of the desirable range of from about 0.020 to about −0.024. Thus this example demonstrates that substrate processing uniformity is not improved for chamber treatment processes which yield values of the ratio of intensities outside of the range of predetermined ratios.

In Example 4, the chamber 106 was treated by first processing a silicon substrate 104 covered by photoresist in the chamber 106 and then processing a bare silicon substrate 104 in the chamber 106. Both substrates 104 were processed according to the above described process, and the overetch step was performed for 10 seconds and with 3 sccm $O_2$. The first etch step to etch the antireflective coating was performed for 31 seconds. The wavelength intensity ratio of a wavelength relating to carbon species to a wavelength relating to silicon species was measured during processing at about 2.6, which was within the range of predetermined ratios. The CD biases for the two production substrates 104 processed after the treatment process, substrates number 3 and 4 on the graph, are connected by line number 401 shown in FIG. 6. FIG. 6 demonstrates that the CD bias for the first substrate 104 processed after the treatment process was substantially close of the second substrate 104. The values of the CD bias were also close to the desirable range of from about −0.020 to about −0.024. Thus this example demonstrates that substrate processing uniformity is improved for chamber treatment processes which yield values of the ratio of intensities within the range of predetermined ratios.

In Example 5, the chamber 106 was treated by first processing a silicon substrate 104 covered by photoresist in the chamber 106 and then processing a bare silicon substrate 104 in the chamber 106. Both substrates 104 were processed according to the above described process, and the overetch step was performed for 20 seconds and with 5 sccm $O_2$. The first etch step to etch the antireflective coating was performed for 31 seconds. The wavelength intensity ratio of a wavelength relating to carbon species to a wavelength relating to silicon species was measured during processing at about 0.21, which was outside of the range of predetermined ratios. The CD biases for the two production substrates 104 processed after the treatment process are overlayed over the results for substrates number 3 and 4 on the graph and are connected by line number 402 shown in FIG. 6. FIG. 6 demonstrates that the CD bias for the first substrate 104 processed after the treatment process was substantially lower than the second substrate 104. The values of the CD bias were also outside of the desirable range of from about −0.020 to about −0.024. Thus this example demonstrates that substrate processing uniformity is not improved for chamber treatment processes which yield values of the ratio of intensities outside of the range of predetermined ratios.

In Example 6, the chamber 106 was treated by first processing a bare silicon substrate 104 in the chamber 106 and then processing a silicon substrate 104 covered by photoresist in the chamber 106. Both substrates 104 were processed according to the above described process, and the overetch step was performed for 15 seconds and with 3 sccm $O_2$. The first etch step to etch the antireflective coating was performed for 31 seconds. The wavelength intensity ratio of a wavelength relating to carbon species to a wavelength relating to silicon species was measured during processing at about 95, which was outside of the range of predetermined ratios. The CD biases for the two production substrates 104 processed after the treatment process, substrates number 5 and 6 and on the graph, are connected by line number 404 shown in FIG. 6. FIG. 6 demonstrates that the CD bias for the first substrate 104 processed after the treatment process was substantially higher than the second substrate 104. The values of the CD bias were also outside of the desirable range of from about −0.020 to about −0.024. Thus this example demonstrates that substrate processing uniformity is not improved for chamber treatment processes which yield values of the ratio of intensities outside of the range of predetermined ratios.

In Example 7, the chamber 106 was treated by first processing a silicon substrate 104 covered by photoresist in the chamber 106 and then processing a bare silicon substrate 104 in the chamber 106. Both substrates 104 were processed according to the above described process, and the overetch step was performed for 10 seconds and with 3 sccm $O_2$. The first etch step to etch the antireflective coating was performed for 55 seconds. The wavelength intensity ratio of a wavelength relating to carbon species to a wavelength relating to silicon species was measured during processing at about 34.2, which was outside of the range of predetermined ratios. The CD biases for the two production substrates 104 processed after the treatment process are overlayed over the results for substrates number 5 and 6 and on the graph and are connected by line number 404 shown in FIG. 6. FIG. 6 demonstrates that the CD bias for the first substrate 104 processed after the treatment process was substantially lower than the second substrate 104. The values of the CD bias were also outside of the desirable range of from about −0.020 to about −0.024. Thus this example demonstrates that substrate processing uniformity is not improved for chamber treatment processes which yield values of the ratio of intensities outside of the range of predetermined ratios.

In Example 8, the chamber 106 was treated by first processing a bare silicon substrate 104 in the chamber 106 and then processing a silicon substrate 104 covered by photoresist in the chamber 106. Both substrates 104 were processed according to the above described process, and the overetch step was performed for 10 seconds and with 3 sccm $O_2$. The first etch step to etch the antireflective coating was performed for 31 seconds. The wavelength intensity ratio of a wavelength relating to carbon species to a wavelength relating to silicon species was measured during processing at about 3.7, which was within the range of predetermined ratios. The CD biases for the two production substrates 104 processed after the treatment process, substrates number 7 and 8 and on the graph, are connected by line number 405 shown in FIG. 6. FIG. 6 demonstrates that the CD bias for the first substrate 104 processed after the treatment process was substantially close to the second substrate 104. The values of the CD bias were also close to the desirable range of from about −0.020 to about −0.024. Thus this example demonstrates that substrate processing uniformity is improved for chamber treatment processes which yield values of the ratio of intensities within the range of predetermined ratios.

In Example 9, the chamber 106 was treated by first processing a silicon substrate 104 covered by photoresist in the chamber 106 and then processing a bare silicon substrate 104 in the chamber 106. Both substrates 104 were processed according to the above described process, and the overetch step was performed for 10 seconds and with 3 sccm $O_2$. The first etch step to etch the antireflective coating was performed for 31 seconds. The wavelength intensity ratio of a wavelength relating to carbon species to a wavelength relating to silicon species was measured during processing at about 3.2, which was within the range of predetermined ratios. The CD biases for the five production substrates 104 processed after the treatment process, substrates number 9, 10, 11, 12 and 13 on the graph, are connected by line number 406 shown in FIG. 6. FIG. 6 demonstrates that the CD bias of the substrates 104 were substantially close to each other. The values of the CD bias were also close to the desirable range of from about −0.020 to about −0.024. Thus this example demonstrates that substrate processing uniformity is improved for chamber treatment processes which yield values of the ratio of intensities within the range of predetermined ratios.

These examples demonstrate that substrate processing variability from one substrate 104 to another, is significantly improved using chamber evaluation and treatment processes according to the present invention, and especially when the evaluated ratio of the intensity of wavelengths of the radiation emitted by the energized gas in the treatment process is within a range of predetermined ratios or is substantially the same as the predetermined ratio.

Although exemplary embodiments of the present invention are shown and described, those of ordinary skill in the art may devise other embodiments which incorporate the present invention, and which are also within the scope of the present invention. For example, other evaluation or treatment processes may be used without deviating from the scope of the present invention. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A substrate processing apparatus comprising:

a chamber comprising a substrate support to support a substrate, a gas supply to provide a gas into the chamber, a gas energizer to energize the gas, and an exhaust to exhaust the gas;

a substrate transport to transport a substrate onto the substrate support in the chamber;

a detector adapted to detect a first intensity of a first wavelength of a radiation emission from the energized gas in the chamber and generate a first signal in relation to the first intensity and detect a second intensity of a second wavelength of the radiation emission and generate a second signal in relation to the second intensity; and a controller adapted to (i) receive the first and second signals from the detector, (ii) perform a mathematical operation on the first and second signals to determine a value of a seasoning state of the chamber, and (iii) treat the chamber in relation to the seasoning state value by forming residues on surfaces in the chamber to obtain a predetermined seasoning state of the chamber that reduces substrate to substrate processing variations, by providing instructions to operate one or more of the substrate transport, substrate support, gas supply, gas energizer and exhaust.

2. An apparatus according to claim 1 wherein the first wavelength is a radiation emission from energized carbon containing species and the second wavelength is a radiation emission from energized silicon containing species.

3. An apparatus according to claim 1 wherein the value is related to a ratio of the first intensity to the second intensity, and wherein the controller is adapted to treat the chamber until the value falls within a range of predetermined values.

4. An apparatus according to claim 3 wherein the range of predetermined values is from about 2 to about 4.

5. An apparatus according to claim 1 wherein the controller is adapted to treat the chamber by providing instructions to introduce a gas into the chamber, energize the gas, and exhaust the gas.

6. An apparatus according to claim 5 wherein the gas comprises $O_2$.

7. An apparatus according to claim 1 wherein the controller is adapted to treat the chamber by providing instructions to (i) transport a first treatment substrate comprising a first material into the chamber, introduce a first gas into the chamber, energize the first gas, and exhaust the first gas, and (ii) transport a second treatment substrate comprising a second material into the chamber, introduce a second gas into the chamber, energize the second gas, and exhaust the second gas.

8. An apparatus according to claim 7 wherein the first material comprises silicon and the second material comprises photoresist.

9. An apparatus according to claim 7 where in the first and second gases comprises etchant gases.

10. A substrate processing apparatus comprising:

a chamber comprising a substrate support to support a substrate, a gas supply to provide a gas into the chamber, a gas energizer to energize the gas, and an exhaust to exhaust the gas;

a substrate transport to transport a substrate onto the substrate support in the chamber;

a detector adapted to detect a first intensity of a first wavelength of a radiation emission from the energized gas in the chamber and generate a first signal in relation to the first intensity and detect a second intensity of a second wavelength of the radiation emission and generate a second signal in relation to the second intensity; and a controller adapted to (i) determine a chamber seasoning state by receiving the first and second signals from the detector and performing a mathematical operation on the first and second signals to determine a value related to a ratio of the first and second signals, (ii) treat the chamber by forming residues on surfaces in the chamber until the value fails within a range of predetermined values indicative of a predetermined seasoning state of the chamber that reduces substrate to substrate processing variations, by providing first instructions to operate one or more of the substrate transport, substrate support, gas supply, gas energizer, and exhaust, and (iii) etch one or more substrates in the chamber by providing second instructions to operate one or more of the substrate transport, substrate support, gas supply, gas energizer, and exhaust.

11. An apparatus according to claim 10 wherein the first wavelength is a radiation emission from energized carbon containing species and the second wavelength is a radiation emission from energized silicon containing species.

12. An apparatus according to claim 11 wherein the range of predetermined values is from about 2 to about 4.

13. An apparatus according to claim 10 wherein the controller is adapted to treat the chamber by providing instructions to transport one or more treatment substrates into the chamber, introduce gas into the chamber, energize the gas, and exhaust the gas.

14. An apparatus according to claim 10 wherein the controller is adapted to treat the chamber by providing instructions to (i) transport a first treatment substrate comprising a first material into the chamber, introduce a first gas into the chamber, energize the first gas, and exhaust the first gas, and (ii) transport a second treatment substrate comprising a second material into the chamber, introduce a second gas into the chamber, energize the second gas, and exhaust the second gas.

15. A substrate processing apparatus comprising:
a chamber comprising a substrate support to support a substrate, a gas supply to provide a gas into the chamber, a gas energizer to energize the gas, and an exhaust to exhaust the gas;
a substrate transport to transport a substrate onto the substrate support in the chamber;
a detector adapted to detect a first intensity of a first wavelength of a radiation emission from energized carbon containing species in the chamber and generate a signal in relation to the first intensity and detect a second intensity of a second wavelength of a radiation emission from energized silicon containing species in the chamber and generate a second signal in relation to the second intensity; and
a controller adapted to provide instructions to operate one or more of the substrate transport, substrate support, gas supply, gas energizer, and exhaust, to:
(i) determine a chamber seasoning state by receiving the first and second signals from the detector and performing a mathematical operation to determine a value related to a ratio of the first intensity to the second intensity,
(ii) treat the chamber by forming residues on surfaces in the chamber until the evaluated value falls within a range of predetermined values indicative of a predetermined seasoning state of the chamber that reduces substrate to substrate processing variations, by providing first instructions to operate one or more of the substrate transport, substrate support, gas supply, gas energizer, and exhaust, to transport one or more treatment substrates into the chamber, the treatment substrates comprising a composition that is selected in relation to the evaluated value, the composition comprising at least one of carbon species and silicon species, introduce gas into the chamber, energize the gas, and exhaust the gas, and
(ii) after treating the chamber, etch one or mare production substrates in the chamber by providing second instructions to operate one or more of the substrate transport, substrate support, gas supply, gas energizer, and exhaust.

16. An apparatus according to claim 15 wherein the range of predetermined values is from about 2 to about 4.

17. An apparatus according to claim 15 wherein the controller is adapted to treat the chamber by selecting a treatment substrate in relation to the evaluated value and providing the first instructions to operate one or more of the substrate transport, substrate support, gas supply, gas energizer, and exhaust, to transport the treatment substrate into the chamber, introduce gas into the chamber, energize the gas, and exhaust the gas.

18. An apparatus according to claim 17 wherein the controller is adapted to repeat (i) receiving the first and second signals and performing the mathematical operation to determine the value, (ii) selecting the treatment substrate in relation to the evaluated value, and (iii) providing the first instructions, until the evaluated value is within the range of predetermined values.

19. An apparatus according to claim 17 wherein the controller is adapted to select a treatment substrate comprising carbon species when the evaluated value is lower than the range of predetermined values, and provide the first instructions to generate residues comprising carbon species on surfaces in the chamber.

20. An apparatus according to claim 17 wherein the controller is adapted to select a treatment substrate comprising silicon species when the evaluated value is higher than the range of predetermined values, and provide the first instructions to generate residues comprising silicon species on surfaces in the chamber.

* * * * *